(12) United States Patent
Kwon et al.

(10) Patent No.: US 10,643,913 B2
(45) Date of Patent: May 5, 2020

(54) APPARATUS AND MECHANISMS FOR REDUCING WARPAGE AND INCREASING SURFACE MOUNT TECHNOLOGY YIELDS IN HIGH PERFORMANCE INTEGRATED CIRCUIT PACKAGES

(71) Applicant: Google LLC, Mountain View, CA (US)

(72) Inventors: Woon Seong Kwon, Cupertino, CA (US); Phillip La, San Ramon, CA (US); Michael Trent Wise, Woodside, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/000,637

(22) Filed: Jun. 5, 2018

(65) Prior Publication Data

US 2019/0172767 A1    Jun. 6, 2019

Related U.S. Application Data (60) Provisional application No. 62/595,538, filed on Dec. 6, 2017.

(51) Int. Cl.
*H01L 23/24* (2006.01)
*H01L 23/00* (2006.01)
(Continued)

(52) U.S. Cl.
CPC ........ *H01L 23/24* (2013.01); *H01L 21/67098* (2013.01); *H01L 21/67121* (2013.01); *H01L 23/16* (2013.01); *H01L 23/562* (2013.01)

(58) Field of Classification Search
CPC . H01L 23/24; H01L 21/67098; H01L 23/562; H01L 21/67121
(Continued)

(56) References Cited

U.S. PATENT DOCUMENTS 6,011,304 A * 1/2000 Mertol .................... H01L 23/04
257/704
8,216,887 B2    7/2012 Heng et al.
(Continued)

OTHER PUBLICATIONS

International Search Report and Written Opinion dated Mar. 4, 2019 in PCT Application No. PCT/US2018/062642.

*Primary Examiner* — Karen Kusumakar
*Assistant Examiner* — Adam S Bowen
(74) *Attorney, Agent, or Firm* — Lerner, David, Littenberg, Krumholz & Mentlik, LLP (57) ABSTRACT

A stiffener apparatus for reducing warpage of an integrated circuit package during heating and cooling are provided. The stiffener apparatus includes an IC substrate configured to receive an IC die on a top side of the IC substrate. The stiffener apparatus includes a primary stiffener ring adhered to the top side of the IC substrate and defining an opening in a region of the IC die such that the primary stiffener ring surrounds the region of the IC die. The primary stiffener ring defines a plurality of grooves. The stiffener apparatus includes a secondary stiffener ring having a plurality of catches configured to engage with the plurality of grooves to removably attach the secondary stiffener ring to the primary stiffener ring on a side of the primary stiffener ring opposite the IC substrate. A method of using a stiffener apparatus during a manufacturing operation is also provided.

18 Claims, 8 Drawing Sheets

(51) Int. Cl.
*H01L 21/67* (2006.01)
*H01L 23/16* (2006.01)

(58) Field of Classification Search
USPC .......................................................... 438/121
See application file for complete search history.

(56) References Cited

U.S. PATENT DOCUMENTS

| | | | | |
|---|---|---|---|---|
| 2001/0040288 A1* | 11/2001 | Matsushima | ........... | H01L 23/10 257/704 |
| 2005/0127484 A1* | 6/2005 | Wills | ....................... | H01L 23/36 257/678 |
| 2005/0224936 A1* | 10/2005 | Wu | ..................... | H01L 23/3128 257/678 |
| 2006/0043553 A1* | 3/2006 | Yang | ................... | H01L 23/4093 257/678 |
| 2007/0108598 A1* | 5/2007 | Zhong | ................. | H01L 23/3128 257/707 |
| 2007/0145571 A1* | 6/2007 | Lee | ........................ | H01L 21/563 257/706 |
| 2007/0164424 A1* | 7/2007 | Dean | ........................ | H01L 23/10 257/707 |
| 2008/0272482 A1* | 11/2008 | Jensen | .................... | H01L 23/04 257/705 |
| 2010/0025081 A1* | 2/2010 | Arai | .................... | H01L 21/4857 174/251 |
| 2010/0276799 A1* | 11/2010 | Heng | ....................... | H01L 21/50 257/704 |
| 2011/0235304 A1* | 9/2011 | Brown | .................... | H01L 23/16 361/820 |
| 2013/0258619 A1* | 10/2013 | Ley | ....................... | H05K 7/1461 361/753 |
| 2014/0167243 A1* | 6/2014 | Shen | ....................... | H01L 23/10 257/692 |
| 2016/0073493 A1* | 3/2016 | Leung | ................... | H05K 1/0271 361/748 |
| 2017/0170087 A1* | 6/2017 | Karhade | ................. | H01L 23/16 |

* cited by examiner

APPARATUS AND MECHANISMS FOR REDUCING WARPAGE AND INCREASING SURFACE MOUNT TECHNOLOGY YIELDS IN HIGH PERFORMANCE INTEGRATED CIRCUIT PACKAGES

RELATED APPLICATIONS

The present application claims priority to, and the benefit of, U.S. Patent Application No. 62/595,538, titled "APPARATUS AND MECHANISMS FOR REDUCING WARPAGE AND INCREASING SURFACE MOUNT TECHNOLOGY YIELDS IN HIGH PERFORMANCE MACHINE LEARNING ASIC PACKAGES" and filed on Dec. 6, 2017, the entire contents of which are hereby incorporated by reference for all purposes.

BACKGROUND

Today's high bandwidth and high performance integrated circuit (IC) chip packages include a large number of integrated circuit components operating at high clock speeds, and thus generating significant amounts of heat. The generated heat can cause warpage of the chip package. To facilitate heat dissipation, chip designers have opted to omit the package lid to implement a direct path between a heat sink and a bare die. Omitting the package lid, however, can weaken the mechanical structure of the IC package and exacerbate warpage during heating and cooling cycles of PCB manufacturing.

SUMMARY

At least one aspect is directed to a stiffener apparatus for reducing warpage of an integrated circuit (IC) package during heating and cooling. The stiffener apparatus includes a primary stiffener ring adhered to a top side of an IC substrate and defining an opening in a region of the IC substrate configured to receive an IC die such that the primary stiffener ring surrounds the region. The stiffener apparatus includes a secondary stiffener ring configured to removably attach to the primary stiffener ring on a side of the primary stiffener ring opposite the IC substrate.

At least one aspect is directed to a method of using a stiffener apparatus during a manufacturing operation. The method includes adhering a primary stiffener ring to a top surface of an integrated circuit (IC) substrate. The method includes removably attaching a secondary stiffener ring to the primary stiffener ring. The method includes mounting the assembly including the IC substrate and the primary stiffener ring to a printed circuit board (PCB). The method includes removing the secondary stiffener ring from the primary stiffener ring.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

This disclosure generally relates to apparatus and methods for reducing warpage and increasing surface mount technology yields in high performance integrated circuit (IC) packages. Today's high bandwidth and high performance IC packages, including application-specific integrated circuit (ASIC) packages, have a large number of integrated circuit components operating at high clock speeds, and thus generating significant amounts of heat. The generated heat can cause warpage of the IC package. To facilitate heat dissipation, chip designers have opted to omit the package lid to create a direct path between a heat sink and a bare IC die in the IC package. Omitting a package lid, however, can weaken the mechanical structure of the chip package and exacerbate warpage during heating and cooling stages of production, such as those associated with a reflow soldering process. The increased warpage can decrease production yields of the IC packages, and lead to increased IC failures in the field.

To reduce warpage of IC chip packages, manufacturers are currently using two different techniques. The first technique includes bonding a stiffener ring to the bare die package. The stiffener ring is taller than the height of the bare die, however, so the presence of the stiffener ring can make heat sinks and cold plates more difficult to attach and less effective for cooling. The second technique includes bonding the stiffener ring to the printed circuit board (PCB) to which the IC package is mounted. That is, the stiffener ring is not bonded directly to the bare die package. This technique, however, does not prevent warpage of the IC package itself.

In order to prevent warpage and utilize a stiffener ring that does not extend above the bare IC die, stiffener apparatus and mechanisms are proposed herein, which increase stiffness of the bare die package during a reflow soldering process, but do not increase the height of the stiffener ring package beyond the thickness of the IC die itself. In particular, a stiffener apparatus according to this disclosure can be formed from a combination of a primary stiffener ring adhered to the IC substrate and not extending above a height of the IC die, and a secondary stiffener ring removably attached to the primary stiffener ring to provide additional structural support against warpage during heating and cooling steps of a manufacturing process. The stiffener apparatus can have an open region in the center and around a region of the IC die. The open region can keep the heat capacity of the IC package and stiffener apparatus assembly low to allow for proper execution of, for example, a reflow soldering process.

Figure 1A:
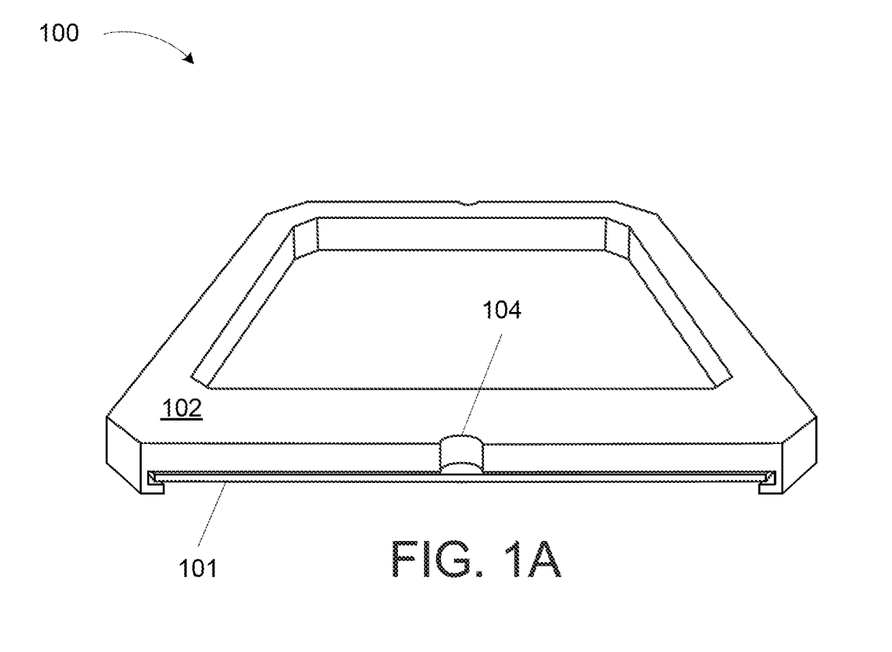
FIGS. 1A and 1B illustrate a first example stiffener apparatus having a twist-lock mechanism.
Figure 1B:
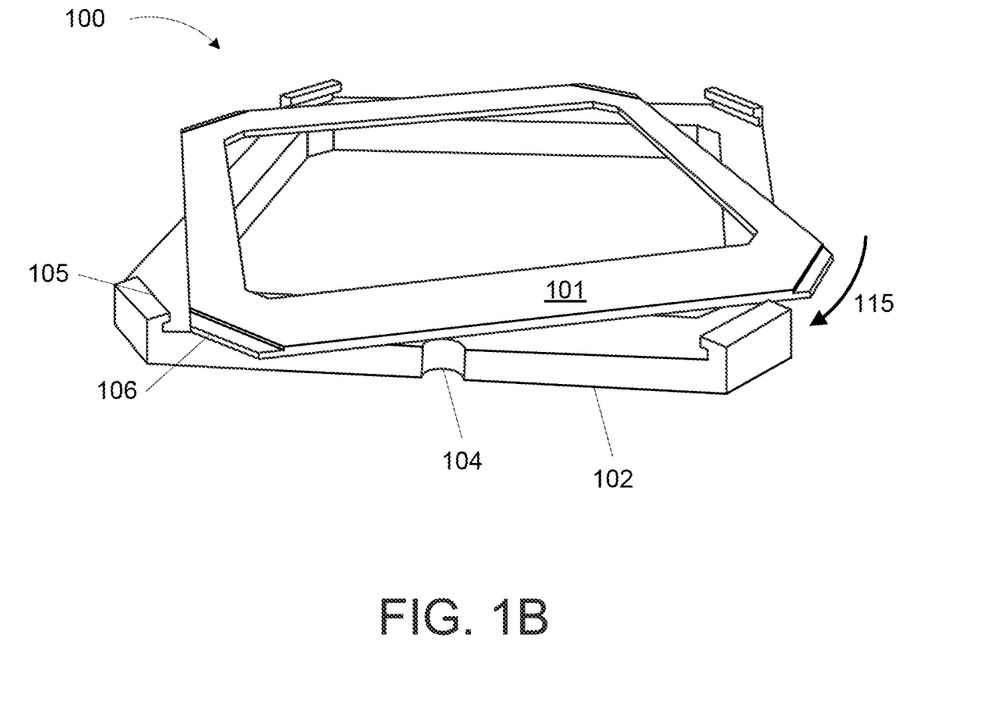

FIGS. 1A and 1B illustrate a first example stiffener apparatus 100 having a twist-lock mechanism. The stiffener apparatus 100 includes two stiffener rings: a primary stiffener ring 101 and a secondary stiffener ring 102. The primary stiffener ring 101 and the secondary stiffener ring 102 can be formed from material with a low coefficient of thermal expansion, such as stainless steel, spring steel, copper, aluminum, or the like. In some implementations, the primary stiffener ring 101 and the secondary stiffener ring 102 can be formed of the same materials. In some implementations, the primary stiffener ring 101 and the secondary stiffener ring 102 can be formed of different material. For example, the primary stiffener ring 101 can be formed of copper, while the secondary stiffener ring can be formed of stainless steel.

The primary stiffener ring 101 and the secondary stiffener ring 102 are removably attached to each other using one or more locking mechanisms. One example locking mechanism is the twist-lock mechanism shown in FIGS. 1A and 1B. FIG. 1B shows the stiffener apparatus 100 flipped upside-down to reveal the twist-lock locking mechanism of the stiffening apparatus 100 shown in FIG. 1A. In FIG. 1B, the primary stiffener ring 101 includes grooves 106. The grooves 106 can be formed either in a side of the primary stiffener ring 101, or by a step on the bottom of the primary stiffener ring 101 that creates a recess between a portion of the primary stiffener ring 101 and an IC substrate to which the primary stiffener ring 101 is attached. FIG. 1B shows an example of grooves 106 formed by steps at the four chamfered corners of the primary stiffener ring 101. The grooves 106 of the primary stiffener ring 101 are configured to receive the catches 105 of the secondary stiffener ring 102. The secondary stiffener ring 102 includes the catches 105 of the twist-lock locking mechanism. The catches can be formed by a protrusion directed inward from near a periphery of the secondary stiffener ring 102. Other examples of the catches 105 can include, but are not limited to, one or more protrusions, clips, hooks, or teeth, which are configured to interlock with the grooves 106 of the primary stiffener ring 101. The catches 105 can engage with the grooves 106 when the secondary stiffener ring 102 is brought into proximity with the primary stiffener ring 101 and rotated relative to the primary stiffener ring 101 as indicated by the arrow 115.

The stiffener apparatus 100 can have an open region in the center and around a region of an IC die. The open region can keep the heat capacity of the IC package and stiffener apparatus 100 assembly low to allow for proper execution of, for example, a reflow soldering process. In some implementations, the secondary stiffener ring 102 can have a solid shape; i.e., with no opening in the middle. In such a configuration, the secondary stiffener ring 102 may not define a ring surrounding an open region per se, but will rather form a solid shape approximating a square, rectangle, or other polygon or compound shape. In such implementations, the solid surface of the secondary stiffener ring 102 can form a protective barrier over the IC die during a manufacturing process.

In some implementations, a thickness of the primary stiffener ring 101 can be such that a height of the primary stiffener ring 101 over the IC substrate to which it is attached is aligned with a height of an IC die on the IC substrate. This can allow for easier attachment of a heat sink to the IC die. In some implementations, the height of the primary stiffener ring 101 over the IC substrate can be less than that of the IC die. In some implementations, the thickness of the primary stiffener ring 101 may be between 0.25 millimeters (mm) and 1.5 mm. In some implementations, the thickness of the primary stiffener ring 101 may be between 0.5 mm and 0.9 mm. In some implementations, the thickness of the secondary stiffener ring 102 may be between 1 mm and 4 mm. After the locking of the primary stiffener ring 101 to the secondary stiffener ring 102, the stiffener apparatus 100 may have a total thickness of between 2.0 mm to 5 mm. In some implementations, the stiffener apparatus 100 may have a total thickness of between 1.0 mm to 10 mm. The primary stiffener ring 101 may be manufactured using a electroforming manufacture process, where a desired material is deposited in a shape and dimension of choice including a desired thickness of the primary stiffener ring 101. In some implementations, in a low volume production of the primary stiffener ring 101, the primary stiffener ring 101 may be manufactured using a non-electroforming machining process. In some implementations, the secondary stiffener ring 102 may be manufactured using a casting manufacturing process. In some implementations, the primary stiffener ring 101 and/or the secondary stiffener right 12 may be manufactured using conventional machining techniques, etching, molding, and metal printing.

The primary stiffener ring 101 and the secondary stiffener ring 102 are configured to removably attach to each other using a locking mechanism, such as the twist-lock locking mechanism, thereby forming the stiffener apparatus 100, prior to the reflow process. The stiffener apparatus 100 can be attached to a substrate of an IC package by attaching the primary stiffener ring 101 to the substrate of the chip package using an adhesive, such as a sealant. In some implementations, the secondary stiffener ring 102 includes one or more notches on its sides, such as notches 104, as shown in FIG. 1A and FIG. 1B. In some implementations, the notches 104 can be defined in the corners of the secondary stiffener ring 102. In some implementations, the secondary stiffener ring 102 is coupled to the primary stiffener ring 101 using the notches 104. For example, a tool or fixture may grip the notches 104 and rotate secondary stiffener ring 102 until the catches 105 of the secondary stiffener ring 102 interlock with the grooves 106 of the primary stiffener ring 101. Once interlocked, the stiffener apparatus 100 resists warpage of the chip package during a reflow soldering process in which the chip package is soldered to a PCB. After the reflow process is completed and the chip package has cooled, the components of the chip package return to a resting thermal state. The secondary stiffener ring 102 can then be removed from the chip package. In some implementations, the tool or fixture can be used to twist the secondary stiffener ring 102 off of the primary stiffener ring 101. In some implementations, the primary stiffener ring 101 can be left on the chip package. In some implementations, the primary stiffener ring 101 can be sized such that a height of the primary stiffener 101 aligns with a height of an IC die on the chip package, facilitating placement of a heat sink onto the IC die. In some implementations, the primary stiffener ring 101 can be left on the chip package. In some implementations, the primary stiffener ring 101 can be sized such that a height of the primary stiffener 101 is lower than a height of the IC die relative to the IC substrate 204.

Figure 1C:
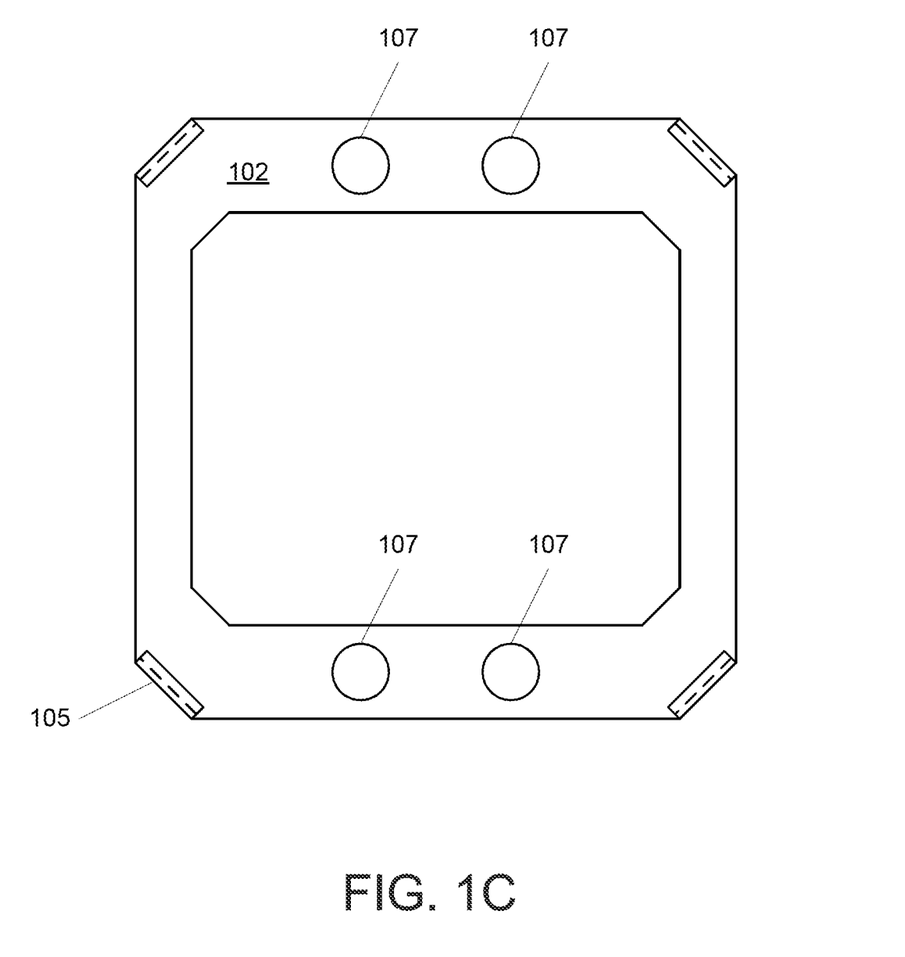
FIG. 1C illustrates the example secondary stiffener ring of FIGS. 1A and 1B with optional magnets.

FIG. 1C illustrates the example secondary stiffener ring 102 of FIGS. 1A and 1B with optional magnets 107. The magnets 107 can provide an attachment force between the primary stiffener ring 101 and the secondary stiffener ring 102. In implementations where the secondary stiffener ring 102 includes the magnets 107, the primary stiffener ring 101 can be made of a magnetic metal or alloy such as spring steel. The magnets 107 can provide the attachment force in locations along the secondary stiffener ring in between where the catches 105 and the grooves 106 attach the primary stiffener ring 101 and the secondary stiffener ring 102. The additional attachment force provided by the magnets 107 can provide further resistance to warpage of the chip package during, for example, a reflow soldering process.

Figure 2A:
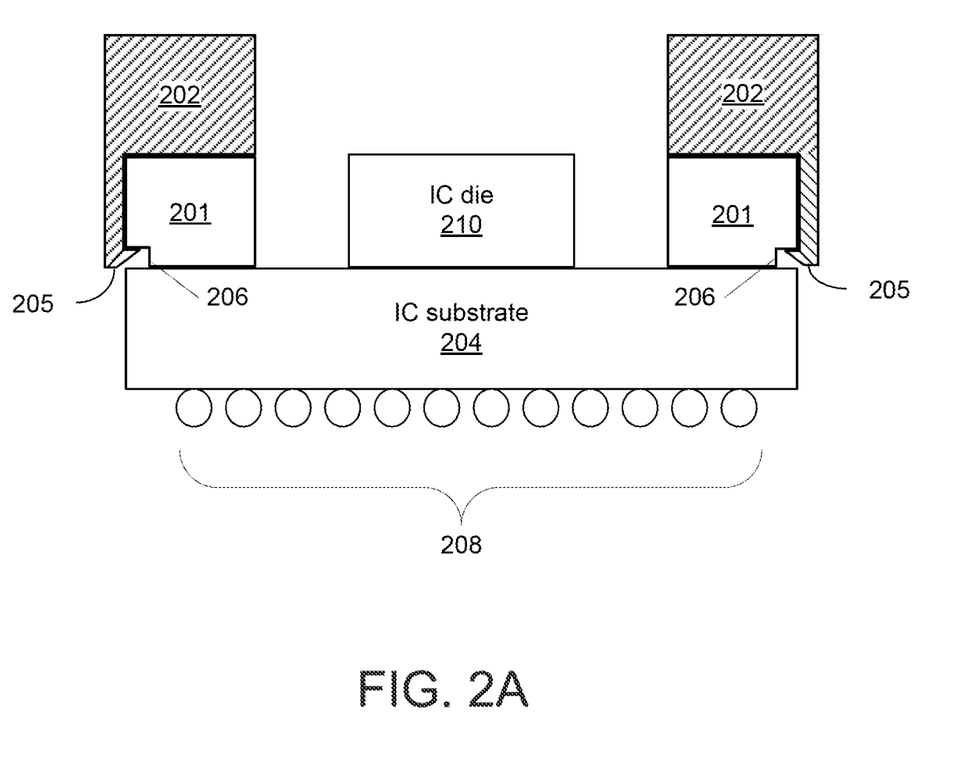
FIG. 2A illustrates a second example stiffener apparatus having a snap-lock mechanism.

FIG. 2A illustrates a second example stiffener apparatus having a snap-lock mechanism. In FIG. 2A, a primary stiffener ring 201 is attached to the IC substrate 204 using an adhesive, such as a sealant. An IC die 210 is also mounted to the IC substrate 204. The IC substrate 204 includes solder balls 208 for electrically and mechanically coupling the IC substrate 204 to a printed circuit board or other device. A secondary stiffener ring 202 includes catches 205 locked into grooves 206 in the primary stiffener ring 201. The catches 205 are designed with a ramp such that, when the secondary stiffener ring 202 is pressed down on to the primary stiffener ring 201, the catches 205 bend outward until the catches 205 travel past the side of the primary stiffener ring 201, and then snap back inward to lock into the grooves 206. When the catches 205 reach the bottom of the primary stiffener ring 201, the catches 205 spring back inwards to latch into the grooves 206, as shown in FIG. 2A. The forced applied downward and from the sides of the secondary stiffener ring 202 reduce warpage of the package and reduce the expansion of the IC substrate 204.

Figure 2B:
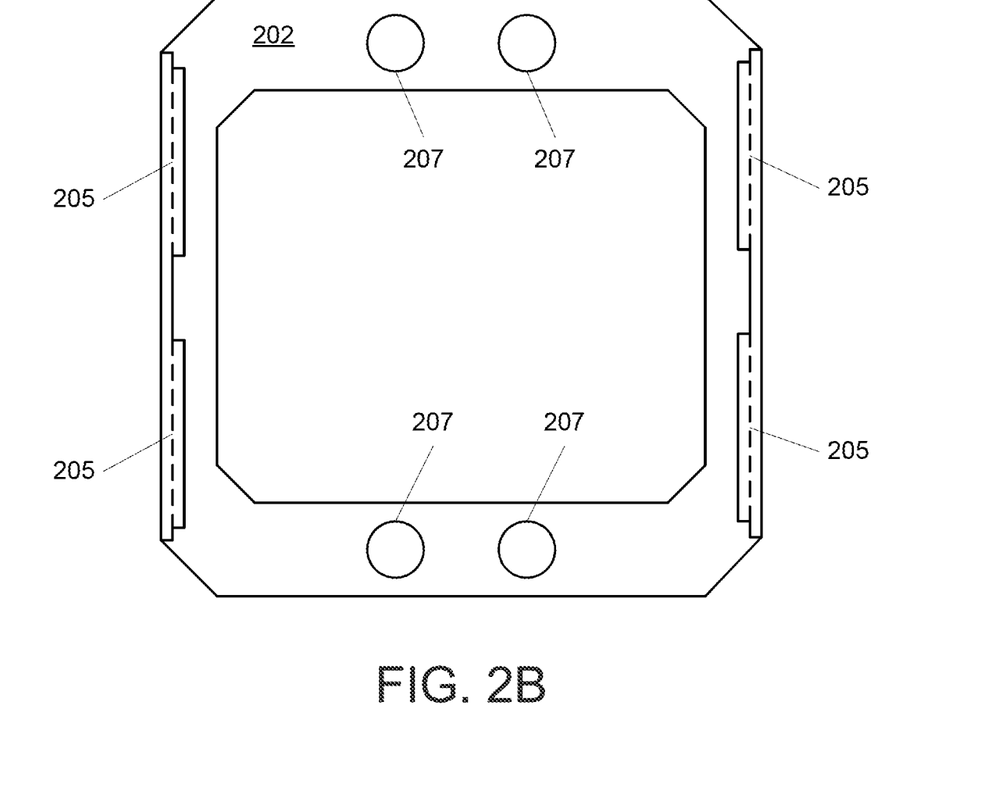
FIG. 2B illustrates the example stiffener apparatus of FIG. 2A with optional magnets in the secondary stiffener ring.

FIG. 2B illustrates the example stiffener apparatus of FIG. 2A with optional magnets 207 in the secondary stiffener ring 202. The magnets 207 can provide an additional attachment force between the primary stiffener ring 201 and the secondary stiffener ring 202. In implementations where the secondary stiffener ring 202 includes the magnets 207, the primary stiffener ring 201 can be made of a magnetic metal or alloy such as spring steel. The magnets 207 can provide the attachment force in locations along the secondary stiffener ring in between where the catches 205 and the grooves 206 attach the primary stiffener ring 201 and the secondary stiffener ring 202. The additional attachment force provided by the magnets 207 can provide further resistance to warpage of the chip package during, for example, a reflow soldering process.

Figure 2C:
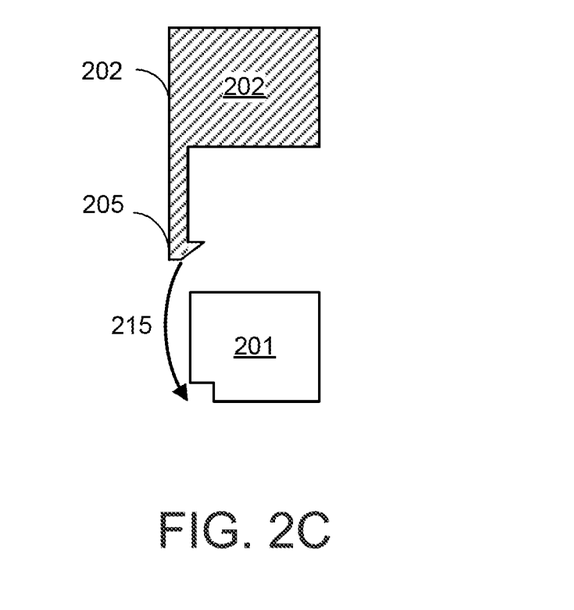
FIG. 2C illustrates the snap-lock mechanism of the example stiffener apparatus of FIG. 2A.

FIG. 2C illustrates the snap-lock mechanism of the example stiffener apparatus of FIG. 2A. As the secondary stiffener ring 202 is pushed downward towards the primary stiffener ring 201, the catch 205 bends outward and snaps back into the groove 206 of the primary stiffener 201 as indicated by the arrow 215.

Figure 3:
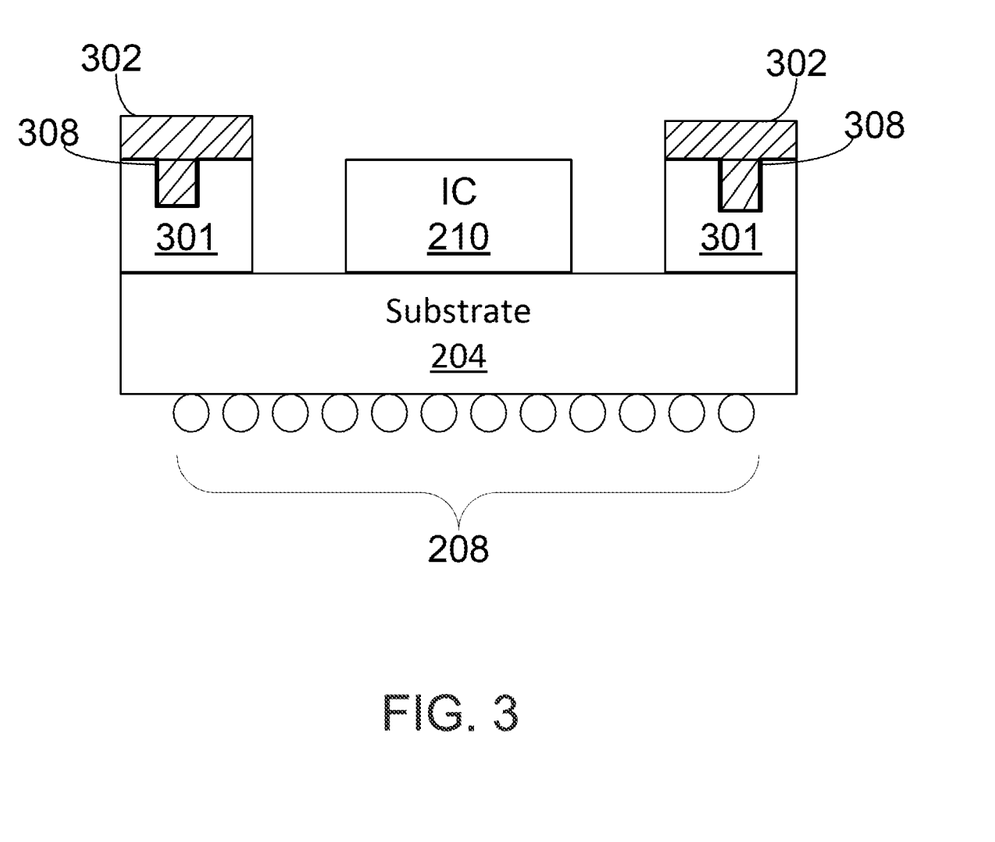
FIG. 3 illustrates a third example stiffener apparatus having an insertion-lock mechanism.

FIG. 3 illustrates a third example stiffener apparatus having an insertion-lock mechanism. In FIG. 3, the primary stiffener ring 301 defines recesses into which protrusions 308 of the secondary stiffener ring 302 insert. In some implementations, the secondary stiffener ring 302 can include four protrusions 308, one at each corner of the secondary stiffener ring 302. In some implementations, the secondary stiffener ring 302 can include eight protrusions 308, one at each corner of the secondary stiffener ring 302 and in the middle of the each side of the secondary stiffener ring 302. Other implementations can include more or fewer protrusions 308 in these and other configurations. The number of recesses and the location of the recesses formed on the primary stiffener ring 301 correspond to the number and location of the protrusions of the secondary stiffener ring 302. The secondary stiffener ring 302 can also include magnets (not shown) to provide an attachment force between the primary stiffener ring 301 and the secondary stiffener ring 302. The magnet can be spaced along the secondary stiffener ring 302 in between protrusions 308, and can provide a force for holding the primary stiffener ring 301 to the secondary stiffener ring 302, while the protrusions 308 can resist sheer movement between the primary stiffener ring 301 to the secondary stiffener ring 302 to resist warpage of the chip package during heating and/or cooling.

Figure 4A:
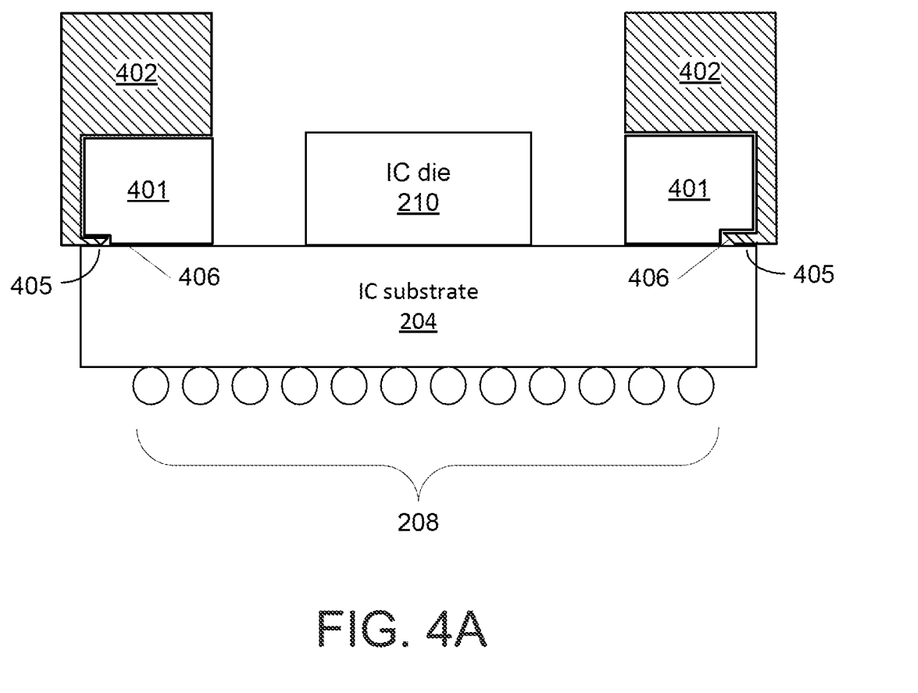
FIG. 4A illustrates a fourth example stiffener apparatus having a slide-lock mechanism.

FIG. 4A illustrates a fourth example stiffener apparatus having a slide-lock mechanism. In FIG. 4A, a primary stiffener ring 401 is attached to the IC substrate 204 using an adhesive, such as a sealant. An IC die 210 is also mounted to the IC substrate 204. The IC substrate 204 includes solder balls 208 for electrically and mechanically coupling the IC substrate 204 to a printed circuit board or other device. A secondary stiffener ring 402 includes catches 405 that lock into grooves 406 in the primary stiffener ring 401. The catches 405 are configured to slide laterally into the grooves 406 of the primary stiffener ring 401, thereby locking into the grooves 406. The secondary stiffener ring 402 can be brought downward onto the top of, but slightly offset to, the primary stiffener ring 401, and then slid laterally into place.

Figure 4B:
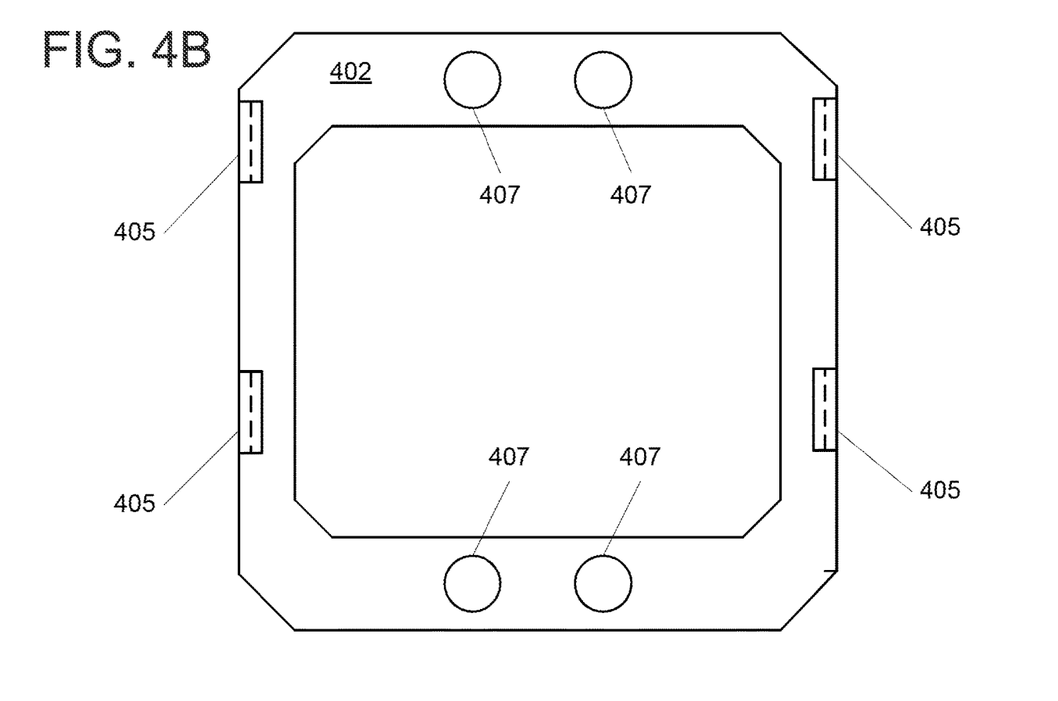
FIG. 4B illustrates the example stiffener apparatus of FIG. 4A with optional magnets in the secondary stiffener ring.

FIG. 4B illustrates the example stiffener apparatus of FIG. 4A with optional magnets 407 in the secondary stiffener ring 402. The magnets 407 can provide an attachment force between the primary stiffener ring 401 and the secondary stiffener ring 402. In implementations where the secondary stiffener ring 402 includes the magnets 407, the primary stiffener ring 401 can be made of a magnetic metal or alloy such as spring steel. The magnets 407 can provide the attachment force in locations along the secondary stiffener ring in between where the catches 405 and the grooves 406 attach the primary stiffener ring 401 and the secondary stiffener ring 402. The additional attachment force provided by the magnets 407 can provide further resistance to warpage of the chip package during, for example, a reflow soldering process.

Figure 4C:
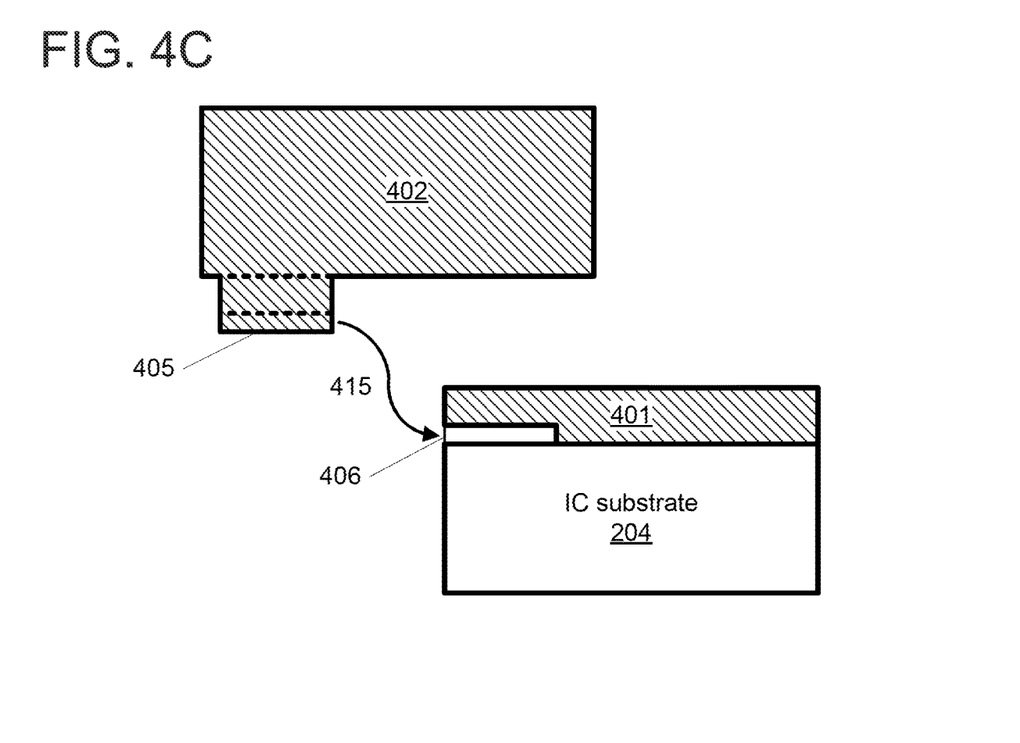
FIG. 4C illustrates the slide-lock mechanism of the example stiffener apparatus of FIG. 4A.

FIG. 4C illustrates the slide-lock mechanism of the example stiffener apparatus of FIG. 4A. The secondary stiffener ring 402 can be brought down and into contact with the primary stiffener ring 401. The secondary stiffener ring 402 can then be moved laterally along the top of the primary stiffener ring 401 such that the catch 405 engages with the groove 406 as indicated by the arrow 415.

The primary stiffener rings 201, 301, and 402 may be formed using the similar manufacturing process as the primary stiffener ring 101 described above. The secondary stiffener rings 202, 302, and 402 may be formed using a similar manufacturing process as used for the secondary stiffener ring 102 described above. Similar to secondary stiffener rings 102, secondary stiffener rings 202, 302, and 402 are configured to be removed from the chip package after the reflow process is completed.

Figure 5:
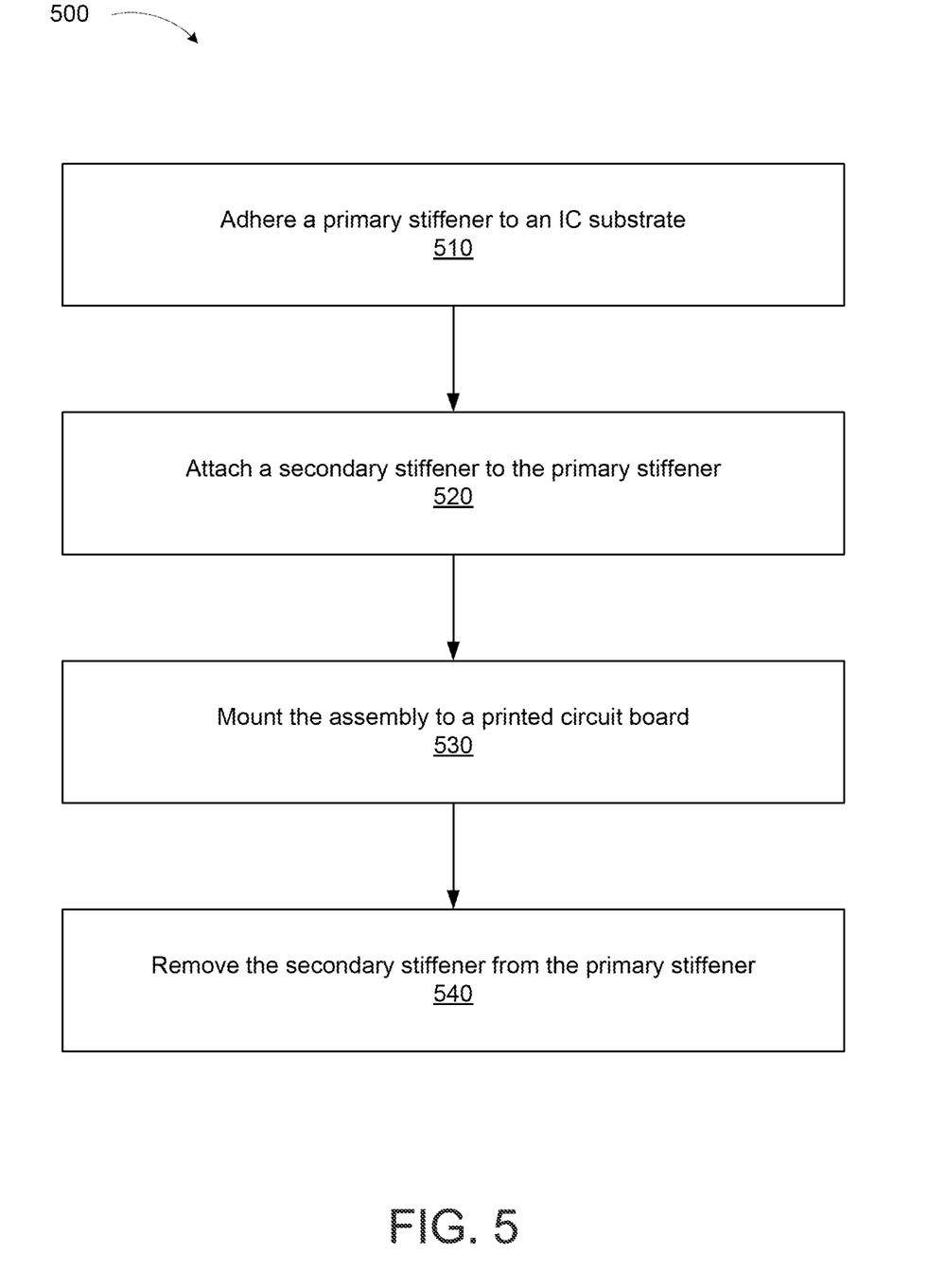
FIG. 5 is a flowchart of an example method of using a stiffener apparatus during a manufacturing operation, according to an example implementation.

FIG. 5 is a flowchart of an example method 500 of using a stiffener apparatus during a manufacturing operation, according to an example implementation. The method 500 includes adhering a primary stiffener ring to an IC substrate (stage 510). The method 500 includes attaching a secondary stiffener ring to the primary stiffener ring (stage 520). The method 500 includes mounting the assembly to a printed circuit board (PCB) (stage 530). The method 500 includes removing the secondary stiffener ring from the primary stiffener ring (stage 540).

The method 500 includes adhering a primary stiffener ring to an IC substrate (stage 510). The primary stiffener ring can be similar to the primary stiffener ring 101, 201, 301, or 401 previously described. The IC substrate can be similar to the IC substrate 204 previously described. The IC substrate may or may not already have an IC die mounted to it. The primary stiffener ring can be adhered to the substrate using a hot clamping method. In an example hot clamping method, the primary stiffener ring can be attached to IC substrate with mechanical compression on the order of a few kilograms, and heated to 50 to 150 degrees Celsius. The bond can be created using an adhesive such as a sealant. A bottom surface of the primary stiffener ring can be adhered to the substrate, and the primary stiffener ring can be sized such that a height of a top surface is aligned with a top surface of the IC die. In some implementations, the height of the top surface of the primary stiffener ring can be lower than the height of the top surface of the IC die, relative to the surface of the IC substrate to which the primary stiffener ring and the IC die are mounted.

The method 500 includes attaching a secondary stiffener ring to the primary stiffener ring (stage 520). The secondary stiffener ring can be similar to the secondary stiffener ring 102, 202, 302, or 402. The secondary stiffener ring and the primary stiffener ring can be twist-locked, snap-locked, slide-locked, or inserted into the primary stiffener ring, depending on the implementation. In some implementations, the force of attachment of the secondary stiffener ring to the primary stiffener ring can be supplemented with magnets embedded in the secondary stiffener ring.

The method 500 includes mounting the assembly to a printed circuit board (PCB) (stage 530). The chip assembly including the stiffener rings can be mounted to a PCB or other device. Mounting can be accomplished initially with a solder paste. The PCB including the chip assembly and stiffener rings can be heated to melt the solder paste, or subjected to a reflow soldering process. During the heating or reflow soldering process, the respective materials of the PCB and the substrate may expand at different rates. During the expansion—and later contraction due to cooling—the stiffener rings can limit warpage of the chip assembly. Limiting the warpage can reduce stress of the bonds between the substrate and the PCB, and the stress of the bonds between the IC and the substrate. This can reduce or eliminate failures to due to the bonds breaking, and thereby increase the yield of the assembly process.

The method 500 includes removing the secondary stiffener ring from the primary stiffener ring (stage 540). Following the heating or reflow soldering process, the secondary stiffener ring can be removed from the primary stiffener ring. Assembly of the PCB and chip assembly can continue with the mounting of a heat sink to the IC die.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A stiffener apparatus for reducing warpage of an integrated circuit (IC) package during heating and cooling, the stiffener apparatus comprising:
    a primary stiffener ring adhered to a top side of an IC substrate and defining an opening in a region of the IC substrate configured to receive an IC die such that the primary stiffener ring surrounds the region;
    a secondary stiffener ring configured to removably attach to the primary stiffener ring on a side of the primary stiffener ring opposite the IC substrate,
    wherein:
    the primary stiffener ring includes a plurality of steps defined by a region of narrower thickness at a periphery of the primary stiffener ring, each step forming a recess between the primary stiffener ring and the IC substrate; and
    the secondary stiffener includes a plurality of catches, each catch formed by a protrusion directed inward from near a periphery of the secondary stiffener ring.

2. The stiffener apparatus of claim 1, wherein:
    the catches are configured to engage with the recesses when the secondary stiffener ring is placed onto the primary stiffener ring and rotated relative to the primary stiffener ring in a plane parallel to the top surface of the IC substrate such that the catches engage with the recesses.

3. The stiffener apparatus of claim 2, wherein the steps are defined at corners of the primary stiffener ring and the catches are defined at corners of the secondary stiffener ring.

4. The stiffener apparatus of claim 2, wherein the secondary stiffener ring defines a plurality of notches along its periphery for receiving a tool to rotate the secondary stiffener ring.

5. The stiffener apparatus of claim 1 wherein:
    the catches are configured to engage with the recesses when the secondary stiffener ring is placed onto and offset from the primary stiffener ring, and the secondary stiffener ring is moved relative to the primary stiffener ring in a plane parallel to the top surface of the IC substrate.

6. The stiffener apparatus of claim 1, wherein:
    the catches are configured to engage with the recesses when a force is exerted downward on the secondary stiffener ring in the direction of the primary stiffener ring such that the catches bend outward and around sides of the primary stiffener ring and then snap into the recesses.

7. A stiffener apparatus for reducing warpage of an integrated circuit (IC) package during heating and cooling, the stiffener apparatus comprising:
a primary stiffener ring adhered to a top side of an IC substrate and defining an opening in a region of the IC substrate configured to receive an IC die such that the primary stiffener ring surrounds the region;
a secondary stiffener ring configured to removably attach to the primary stiffener ring on a side of the primary stiffener ring opposite the IC substrate,
wherein
the primary stiffener ring includes a magnetic metal or alloy, and
the secondary stiffener ring includes a plurality of magnets, each magnet placed in regions of the secondary stiffener ring between the catches.

8. A stiffener apparatus for reducing warpage of an integrated circuit (IC) package during heating and cooling, the stiffener apparatus comprising:
a primary stiffener ring adhered to a top side of an IC substrate and defining an opening in a region of the IC substrate configured to receive an IC die such that the primary stiffener ring surrounds the region;
a secondary stiffener ring configured to removably attach to the primary stiffener ring on a side of the primary stiffener ring opposite the IC substrate,
wherein the primary stiffener ring has a height relative to the top surface of the IC substrate that is equal to or less than a height of an IC die relative to the top surface of the IC substrate.

9. A stiffener apparatus for reducing warpage of an integrated circuit (IC) package during heating and cooling, the stiffener apparatus comprising:
a primary stiffener ring adhered to a top side of an IC substrate and defining an opening in a region of the IC substrate configured to receive an IC die such that the primary stiffener ring surrounds the region;
a secondary stiffener ring configured to removably attach to the primary stiffener ring on a side of the primary stiffener ring opposite the IC substrate,
wherein the secondary stiffener ring has a thickness in a direction normal to the top surface of the IC substrate that is thicker than a thickness of the primary stiffener ring.

10. A method of using a stiffener apparatus during a manufacturing operation, the method comprising:
adhering a primary stiffener ring to a top surface of an integrated circuit (IC) substrate;
removably attaching a secondary stiffener ring to the primary stiffener ring;
mounting the assembly including the IC substrate, the primary stiffener ring, and the secondary stiffener ring to a printed circuit board (PCB); and
removing the secondary stiffener ring from the primary stiffener ring,
wherein:
the primary stiffener ring includes a plurality of steps defined by a region of narrower thickness at a periphery of the primary stiffener ring, each step forming a recess between the primary stiffener ring and the IC substrate; and
the secondary stiffener includes a plurality of catches, each catch formed by a protrusion directed inward from near a periphery of the secondary stiffener ring.

11. The method of claim 10, wherein mounting the assembly to the PCB includes a reflow soldering process.

12. The method of claim 10, wherein:
removably attaching the secondary stiffener ring to the primary stiffener ring includes placing the secondary stiffener ring onto the primary stiffener ring and rotating the secondary stiffener ring relative to the primary stiffener ring in a plane parallel to the top surface of the IC substrate such that the catches engage with the recesses.

13. The method of claim 12, wherein:
rotating the secondary stiffener ring includes engaging a tool into a plurality of notches defined along a periphery of the secondary stiffener ring and rotating the secondary stiffener ring using the tool.

14. The method of claim 10, wherein:
removably attaching the secondary stiffener ring to the primary stiffener ring includes placing the secondary stiffener ring onto and offset from the primary stiffener ring, and
sliding the secondary stiffener ring relative to the primary stiffener ring in a plane parallel to the top surface of the IC substrate such that the catches engage with the recesses.

15. The method of claim 10, wherein:
removably attaching the secondary stiffener ring to the primary stiffener ring includes exerting a force on the secondary stiffener ring downward in the direction of the primary stiffener ring such that the catches bend outward and around sides of the primary stiffener ring and then snap into the recesses.

16. A method of using a stiffener apparatus during a manufacturing operation, the method comprising:
adhering a primary stiffener ring to a top surface of an integrated circuit (IC) substrate;
removably attaching a secondary stiffener ring to the primary stiffener ring;
mounting the assembly including the IC substrate, the primary stiffener ring, and the secondary stiffener ring to a printed circuit board (PCB); and
removing the secondary stiffener ring from the primary stiffener ring,
wherein:
the primary stiffener ring includes a magnetic metal or alloy;
the secondary stiffener ring includes a plurality of magnets, each magnet placed in regions of the secondary stiffener ring between the catches; and
removably attaching the secondary stiffener ring to the primary stiffener ring includes engaging the magnets of the secondary stiffener ring to the primary stiffener ring.

17. A method of using a stiffener apparatus during a manufacturing operation, the method comprising:
adhering a primary stiffener ring to a top surface of an integrated circuit (IC) substrate;
removably attaching a secondary stiffener ring to the primary stiffener ring;
mounting the assembly including the IC substrate, the primary stiffener ring, and the secondary stiffener ring to a printed circuit board (PCB); and
removing the secondary stiffener ring from the primary stiffener ring,
wherein the primary stiffener ring has a height relative to the top surface of the IC substrate that is equal to or less than a height of an IC die relative to the top surface of the IC substrate.

18. A method of using a stiffener apparatus during a manufacturing operation, the method comprising:
adhering a primary stiffener ring to a top surface of an integrated circuit (IC) substrate;
removably attaching a secondary stiffener ring to the primary stiffener ring;
mounting the assembly including the IC substrate, the primary stiffener ring, and the secondary stiffener ring to a printed circuit board (PCB); and
removing the secondary stiffener ring from the primary stiffener ring,
wherein the secondary stiffener ring has a thickness in a direction normal to the top surface of the IC substrate that is thicker than a thickness of the primary stiffener ring.

* * * * *